United States Patent
Frindle

(10) Patent No.: US 7,369,906 B2
(45) Date of Patent: May 6, 2008

(54) DIGITAL AUDIO SIGNAL PROCESSING

(75) Inventor: Paul Anthony Frindle, Witney (GB)

(73) Assignee: Sony United Kingdom Limited, Weybridge (GB)

( * ) Notice: Subject to any disclaimer, the term of this patent is extended or adjusted under 35 U.S.C. 154(b) by 818 days.

(21) Appl. No.: 10/108,913

(22) Filed: Mar. 28, 2002

(65) Prior Publication Data
US 2002/0173865 A1 Nov. 21, 2002

(30) Foreign Application Priority Data
Mar. 30, 2001 (GB) ................. 0108113.2

(51) Int. Cl.
G06F 17/00 (2006.01)
H03G 3/00 (2006.01)

(52) U.S. Cl. ......................... 700/94; 381/104

(58) Field of Classification Search ........... 700/94; 381/104, 105, 107, 98; 704/224, 225
See application file for complete search history.

(56) References Cited

U.S. PATENT DOCUMENTS

| 5,524,060 | A | * | 6/1996 | Silfvast et al. .............. 381/104 |
| 5,530,767 | A |   | 6/1996 | Yoshida |
| 5,892,834 | A |   | 4/1999 | Smart et al. |
| 5,903,871 | A | * | 5/1999 | Terui et al. .................. 704/500 |
| 5,907,823 | A | * | 5/1999 | Sjoberg et al. ............. 704/225 |
| 5,983,087 | A | * | 11/1999 | Milne et al. ................ 455/149 |
| 6,088,461 | A | * | 7/2000 | Lin et al. .................... 381/104 |
| 6,363,343 | B1 | * | 3/2002 | Horos ........................ 704/225 |
| 6,535,846 | B1 | * | 3/2003 | Shashoua .................... 704/225 |
| 6,757,396 | B1 | * | 6/2004 | Allred ........................ 381/106 |
| 6,885,752 | B1 | * | 4/2005 | Chabries et al. ............ 381/321 |

FOREIGN PATENT DOCUMENTS

GB 2 198 909 6/1988
JP 6-253385 9/1994

OTHER PUBLICATIONS

National Deaf Education Center document for Reading an Audiogram.*

* cited by examiner

*Primary Examiner*—Sinh Tran
*Assistant Examiner*—Andrew C Flanders
(74) *Attorney, Agent, or Firm*—Oblon, Spivak, McClelland, Maier & Neustadt, P.C.

(57) ABSTRACT

A digital audio processor comprises at least one digital audio sample mapping module and produces a sequence of output digital audio sample values by applying a quasi time-invariant transfer function to each input digital audio sample value, the transfer function being arranged so that a ratio of root mean square signal level to peak signal magnitude is lower for the input digital audio signal than for a corresponding portion of the output digital audio signal.

22 Claims, 8 Drawing Sheets

DIGITAL AUDIO SIGNAL PROCESSING

BACKGROUND OF THE INVENTION

1. Field of the Invention

This invention relates to the processing of digital audio signals.

2. Description of the Prior Art

Many modern audio signal processing devices perform audio processing operations on sampled digital audio signals rather than on analogue signals. Digital audio signals which signify discrete and clearly defined voltage levels have the advantage over analogue signals that they can be repeatedly copied without any degradation of the audio signal quality. Furthermore, error correction techniques can be applied to digitally encoded data prior to reproduction and some types of noise can be removed. Once an audio signal has been stored in digital form the data is not restricted to a particular time domain but can be manipulated and processed at will. The compact disc is an example of a digital audio storage device.

An analogue audio signal can be converted to its digital equivalent using a technique known as pulse code modulation (PCM). In the PCM technique the analogue signal is sampled in time at a frequency high enough to enable the desired audio bandwidth to be achieved. In the case of the CD the specified audio bandwidth is 20 Hz to 20 kHz and a sampling frequency of 44.1 kHz is typically used. In a process known as quantisation the measured signal voltage level at the instant of sampling is represented numerically as its nearest equivalent value in binary form. The mapping of voltage values from a continuous range to a finite number of discrete levels results in quantisation error. The larger the number of bits per sample, the smaller the quantisation error. Consumer audio applications typically use 16 bit numbers which can represent $2^{16}$ distinct voltage levels.

The CD has a comparatively large dynamic range, typically greater than 90 dB whereas an analogue tape may have a dynamic range of only 40 dB.

Although the perception of sound is a complex topic and is not well understood, it has been proposed that the ear responds to average levels rather than peak levels when judging loudness.

In almost every sound system there is a need to control the audio signal dynamics to ensure that quiet segments are audible to the listener and that loud segments do not cause distortion or system damage. Since it has also been proposed that the highest peak will generally determine the comfortable listening level for the volume setting, a large dynamic range may mean that the quieter audio segments are too quiet for the listener to distinguish. The process of dynamic range reduction is known as dynamics processing and it involves non-linear adjustment (or "compression") of the gain applied to an audio signal. Compression typically results in the audio signal sounding louder on replay.

A compressor is a voltage controlled amplifier with an input, an output and at least one control port fed by a level or peak detector. The signal level at which compression kicks in is known as the threshold. In upward compression, the threshold defines the point below which boost ensues. In downward compression the threshold defines the point above which gain reduction occurs. A compressor whose output level changes by 1 dB for an N dB input level change above threshold has an N:1 compression ratio. Typical compression ratios would be 2:1 or 4:1.

Compression is not applied independently to each input sample. The delay between the onset of a transient and the time when compression commences is known as the attack. The delay between the subsidence of a transient and the time the compressor returns to a resting gain is the release or decay.

If the attack takes too long the signal may "clip" but if it happens too quickly the audio content loses dynamic impact for the listener. The release time determines what frequencies the compressor can process without inducing undue distortion. Frequencies below the reciprocal of the release time are subject to increased distortion e.g. for a release time of 10 ms distortion increases below 100 Hz. Since no single attack/release suits all audio signals, split-band compressors are sometimes used in which each audio band feeds a separate compressor whose attack and release are optimised for the particular band.

FIG. 1 of the accompanying drawings schematically illustrates a known dynamics processor. The input digital audio signal is supplied to a peak/level detector 10 and an output signal 5 of the peak/level detector is supplied as input to a dynamics processing unit 20. The dynamics processing unit 20 can be arranged to produce various different dynamics processing functions depending on the relationship between the gain control value generated and the detected envelope of the input digital audio signal.

Such techniques involving compression operations in the time domain can be used to make reproduced audio sound louder to the listener. Similar analogue techniques for making reproduced audio signals sound louder have been around for many years in the broadcasting industry and used for example to make a particular radio station sound louder than its competitors while still being subject to the same FM deviation limits.

The output voltage levels on replay of a PCM digital recording are constrained by the number of quantization levels which is determined by the number of bits used to encode each sample. The maximum output voltage will be dependent upon the maximum binary sample value and the discrete voltage levels will typically be equally spaced. Any excursions of the voltage level above the maximum output voltage will result in a distortion of the waveform known as "clipping".

Consider an example where the dynamics processing involves a simple 4:1 compression above an input envelope threshold T. This example compression response is illustrated schematically by FIG. 2A of the accompanying drawings. FIG. 2B shows the corresponding gain which is unity below the threshold and ¼ above the threshold. The output of the dynamics processing unit 20 is a gain control value 15 that will typically be a time dependent function calculated in dependence upon numerous input samples. The gain control value 15 is supplied as an input to a gain controller 40. The peak/level detection unit 10 outputs a signal 25 corresponding to a sequence of input signal values to a time delay unit 30. The time delay unit 30 delays the input samples to compensate for the processing time required by the dynamics processing unit 20. The output 35 of the time delay unit 30 is supplied to the gain controller where the input sample values are multiplied by the appropriate gain control value 15 to produce an output signal.

SUMMARY OF THE INVENTION

The present invention provides a digital audio processing apparatus for processing a sequence of input digital audio sample values representing an input digital audio signal to generate a respective sequence of output digital audio sample values representing an output digital audio signal, the apparatus comprising at least one digital audio sample mapping module operable to apply a quasi time-invariant transfer function to each input digital audio sample value, the transfer function being arranged so that a ratio of root mean square signal level to peak signal magnitude is lower for the input digital audio signal than for a corresponding portion of the output digital audio signal. The transfer function is quasi time-invariant because although a sample mapping will typically be performed according to a fixed predetermined time-invariant transfer function, the transfer function can be reconfigured by the user to suit a particular input digital audio source.

The invention recognises that by applying a time-invariant transfer function of a predetermined form to a digital audio signal, the perceived loudness of the reproduced audio signal can be increased. The simple time-invariant transfer function of the sample mapping means that little hardware is required. The increase in perceived loudness can be achieved without increasing the amount of clipping in the reproduced signal.

A digital audio signal processing device according to embodiments of the present invention can be implemented in the digital regime either prior to recording or on reproduction. In the case of a signal transmission arrangement, the processing device could be implemented in the digital regime before or during transmission or after reception.

The transfer function according to embodiments of the invention is time invariant, hence the mapping operates independently on each input sample. This time-invariance is an important distinction from standard compression techniques.

It will be appreciated that the transfer function could take any form at the extremes of the input sample value range and at the origin. However it is preferred that the transfer function meets the unmodified response curve at these points. This has the advantages of reducing the likelihood of clipping and reducing distortions in the reproduced sound.

Although the sample mapping could be performed on an input sample sequence comprising a range of frequencies it is preferable to filter the input sample sequence into two or more different frequency bands and to perform the sample mapping separately on each frequency band. This has the advantage of reducing intermodulation distortion in the reproduced audio signal.

Although the sample mapping can be performed on every input digital audio signal it is advantageous to provide a user control to switch the sample mapping on or off according to user requirements.

Although the sample mapping can be performed according to a fixed predetermined time-invariant transfer function it is advantageous to provide a user-control to allow the user to modify a quasi time-invariant transfer function to suit the particular input digital audio source.

BRIEF DESCRIPTION OF THE DRAWINGS

The above and other objects, features and advantages of the invention will be apparent from the following detailed description of illustrative embodiments which is to be read in connection with the accompanying drawings, in which.

DESCRIPTION OF THE PREFERRED EMBODIMENTS

Figure 1:
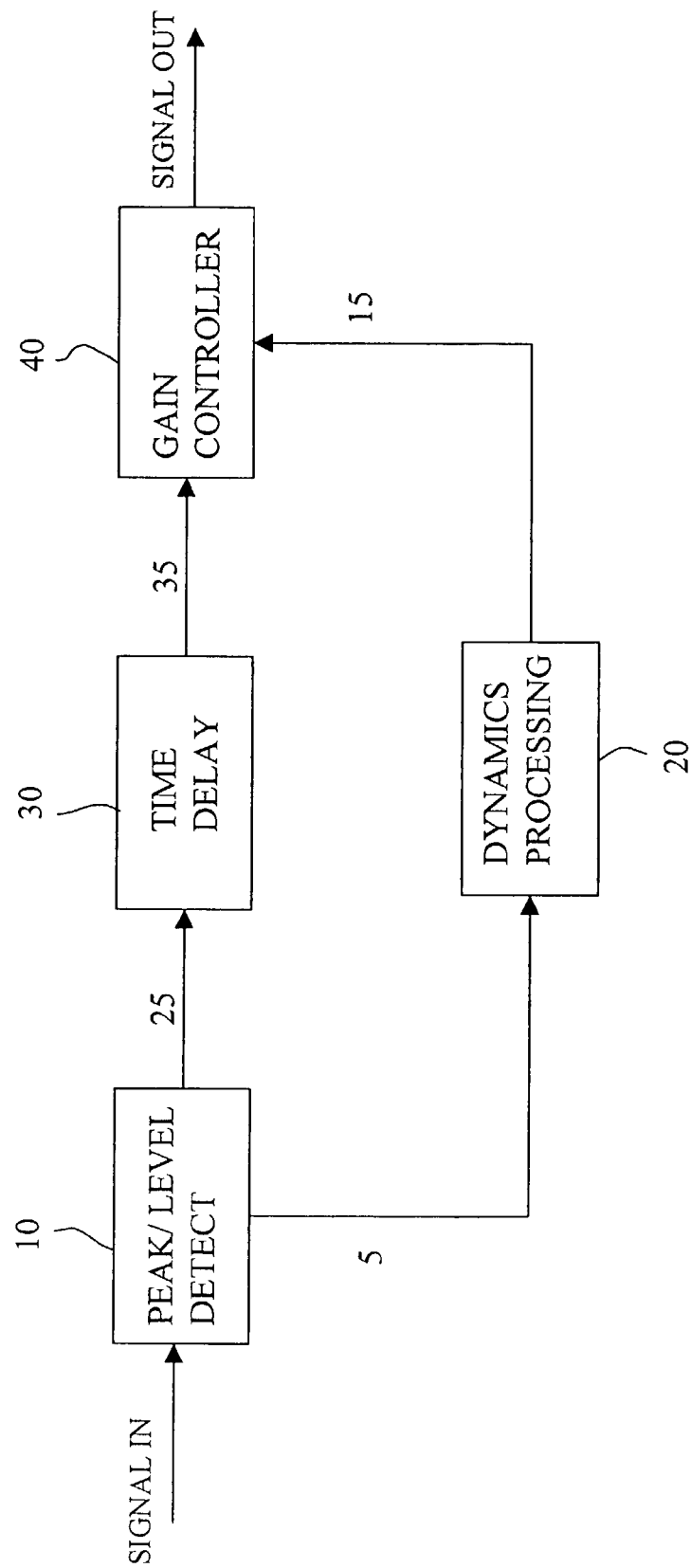
FIG. 1 is a schematic diagram of a dynamics processor.
Figures 2A, 2B:
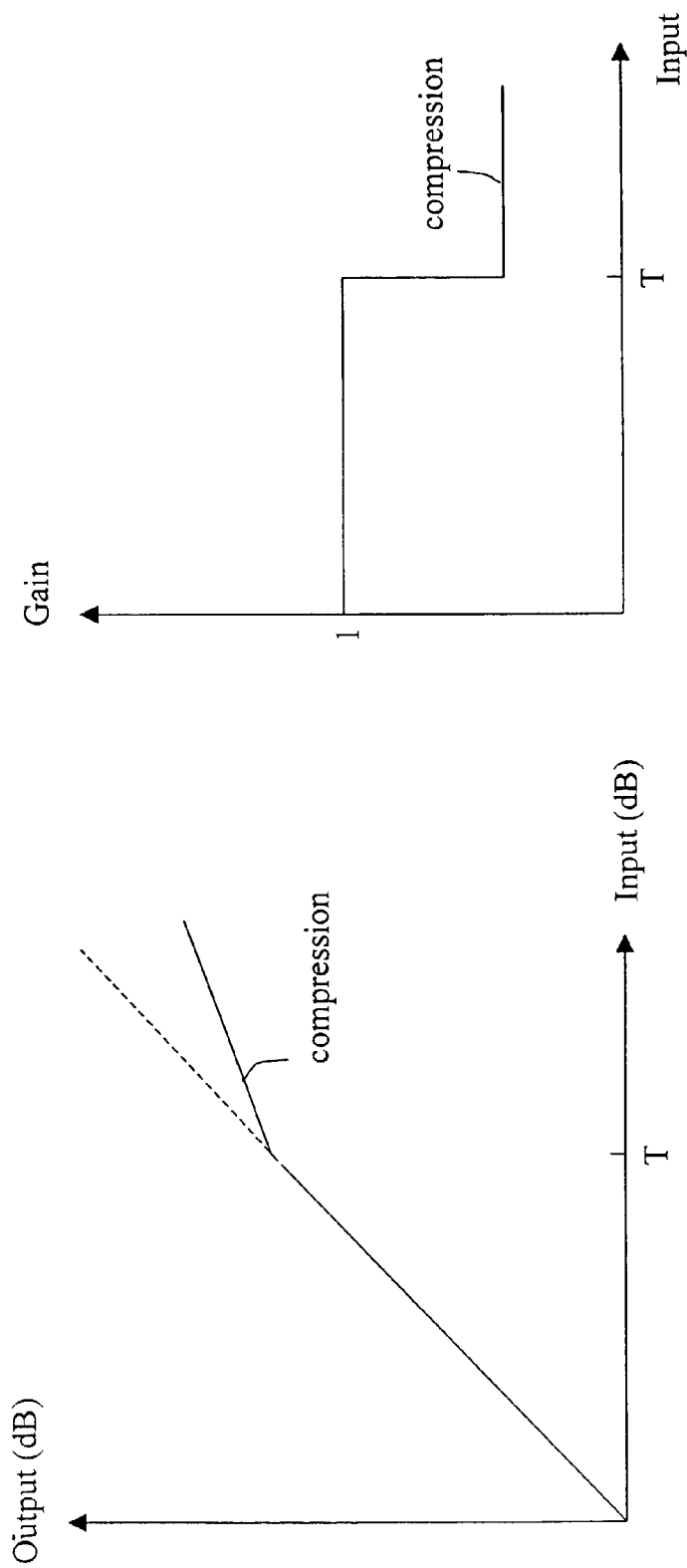
FIG. 2A is a schematic graph of a simple compression response of the processor of FIG. 1.
FIG. 2B is a schematic graph illustrating the gain associated with the simple compression response of FIG. 2A as a function of the input.
Figure 3:
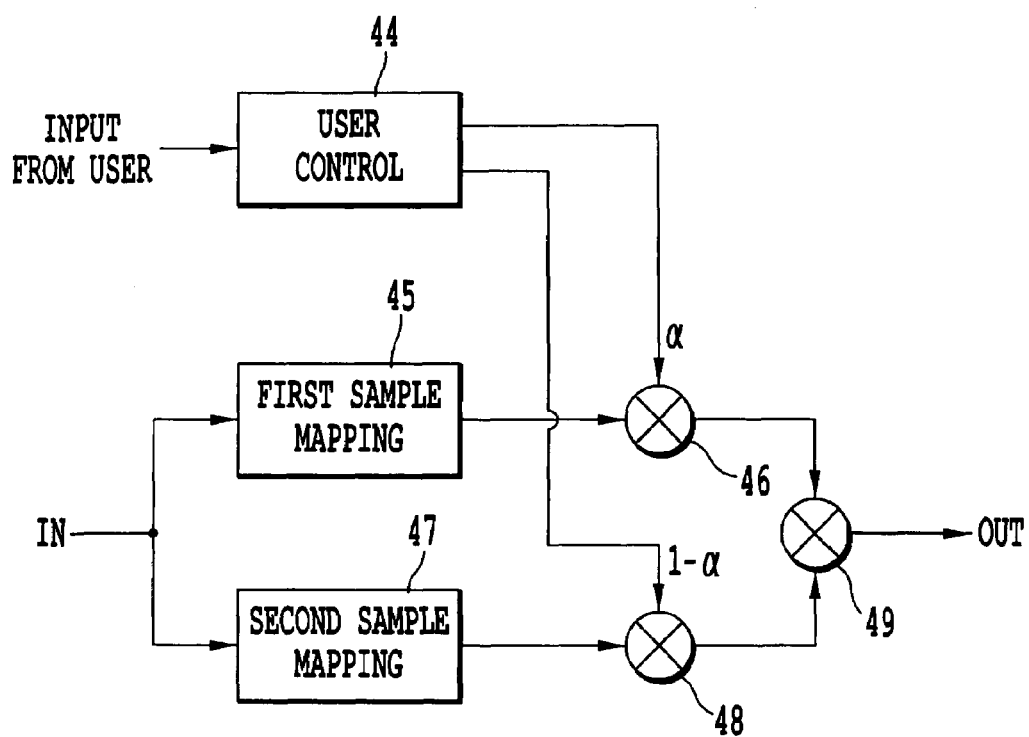
FIG. 3 is a schematic diagram of a digital audio signal processing apparatus according a first embodiment of the invention.

FIG. 3 is a schematic diagram of a digital audio signal processing apparatus according to a first embodiment of the invention. An input digital audio signal is supplied to a first sample mapping module 45 that processes the input sample values to produce first output sample values according to a first predetermined transfer function. The first output sample values are input to first multiplier 46 which multiplies the first output sample values by a variable $\alpha$ to produce a first modified output sample value. The input digital audio signal is also supplied to a second sample mapping module 47 that processes the input sample values to produce second output sample values according to a second predetermined transfer function. The output of the second sample mapping module 47 is input to second multiplier 48 which multiplies this output by a variable $1-\alpha$ to produce a second modified output sample value. User control 44 receives variable $\alpha$ from a user and supplies this variable to first multiplier 46 and second multiplier 48. The first and second modified sample values are added by adder 49. The first and second transfer mapping functions can be implemented in either software or hardware.

In software the transfer function can be implemented by providing a lookup table to obtain a mapped sample value for each input digital sample value. The software for implementing the transfer function that defines the sample mapping can be stored on a computer storage medium such as a floppy disk, a CD ROM or a hard drive. Alternatively the software for performing the sample mapping could be downloaded from a network or from the Internet. In hardware the sample mapping can be implemented using a read only memory (ROM) with $2^{16}$ memory addresses (for 16-bit samples) to hold a persistent record of the mapped output sample value corresponding to each of the possible input sample values. So the input sample value would form the address input to the ROM and the 16 bit data stored at that address would form the output sample value.

Figures 4A, 4B:
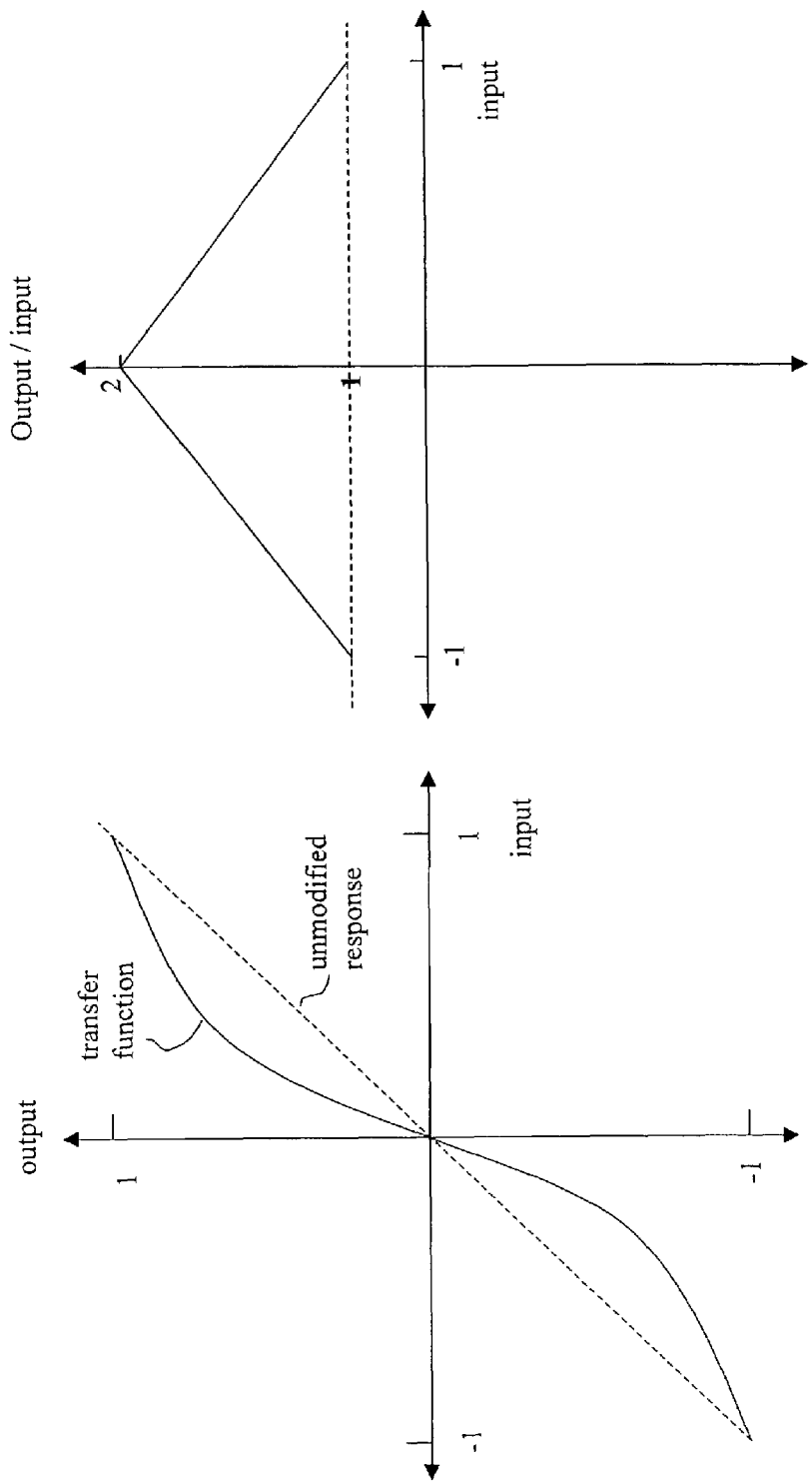
FIG. 4A is a schematic graph of a digital sample mapping function used by the digital audio signal processing device of FIG. 3.
FIG. 4B is a schematic graph of the ratio of output to input sample values as a function of the input sample value associated with the digital sample mapping function of FIG. 4A.

The transfer function that is implemented by the sample mapping module is illustrated schematically in FIG. 4A which is a graph of output sample value against input sample value over a normalised range of −1 to 1. The sample values are discrete and the number of values in the range is given by $2^n$ for n-bit sample values. To provide a comparison, the straight line through the origin represents an unmodified response such that the output sample value is substantially equal to the input sample value. For the unmodified response the gain is unity and there is no compression.

The transfer function is preferably parabolic in form. A preferred transfer function is specified by the following equation:

$$y=2x(1-\text{abs}(0.5x)).$$

where y represents the output sample value, x represents the input sample value and abs denotes the absolute value.

The above transfer function can be used with a crossfade function between the above transfer function and a linear (1:1) transfer function, with the degree of crossfade being controlled by a user control (not shown). In this case the transfer function may be given by $$y = \frac{x(1-\text{abs}(x)*0.5c)}{(1-0.5c)}$$

where c is a control value in the inclusive range between zero and one. Taking into account the implementation of the cross-fade function, the transfer function is quasi time-invariant.

At one extreme, if c=0, then y=x and the output samples are identical to the corresponding input samples. At the other extreme, c=1, the transfer function follows the parabolic form given above. In between these two extremes, the transfer function is effectively a milder version of the parabolic function.

The transfer function meets the unmodified response at (−1,−1), (0,0) and (+1,+1) for this embodiment. However there are alternative embodiments in which this is not the case. The form of the transfer function is such that more than one input sample value can be mapped to a single output sample value.

FIG. 4B illustrates schematically the gain (output sample value/input sample value) associated with the transfer function against the input sample value. From FIG. 4B it can be seen that the gain is a maximum close to the origin in the centre of the input sample value range and decreases linearly to the unmodified gain of unity at the upper and lower extremes of the range. The graph of gain against input is symmetrical about the y axis.

In alternative embodiments of the invention the gain could be constant over at least one continuous range of input sample values. However the gain for input sample values of small magnitude is greater or equal to the gain for input sample values of comparatively large magnitude. The gain is preferably constrained such that no additional clipping is introduced with respect to the input sample values.

Figure 4C:
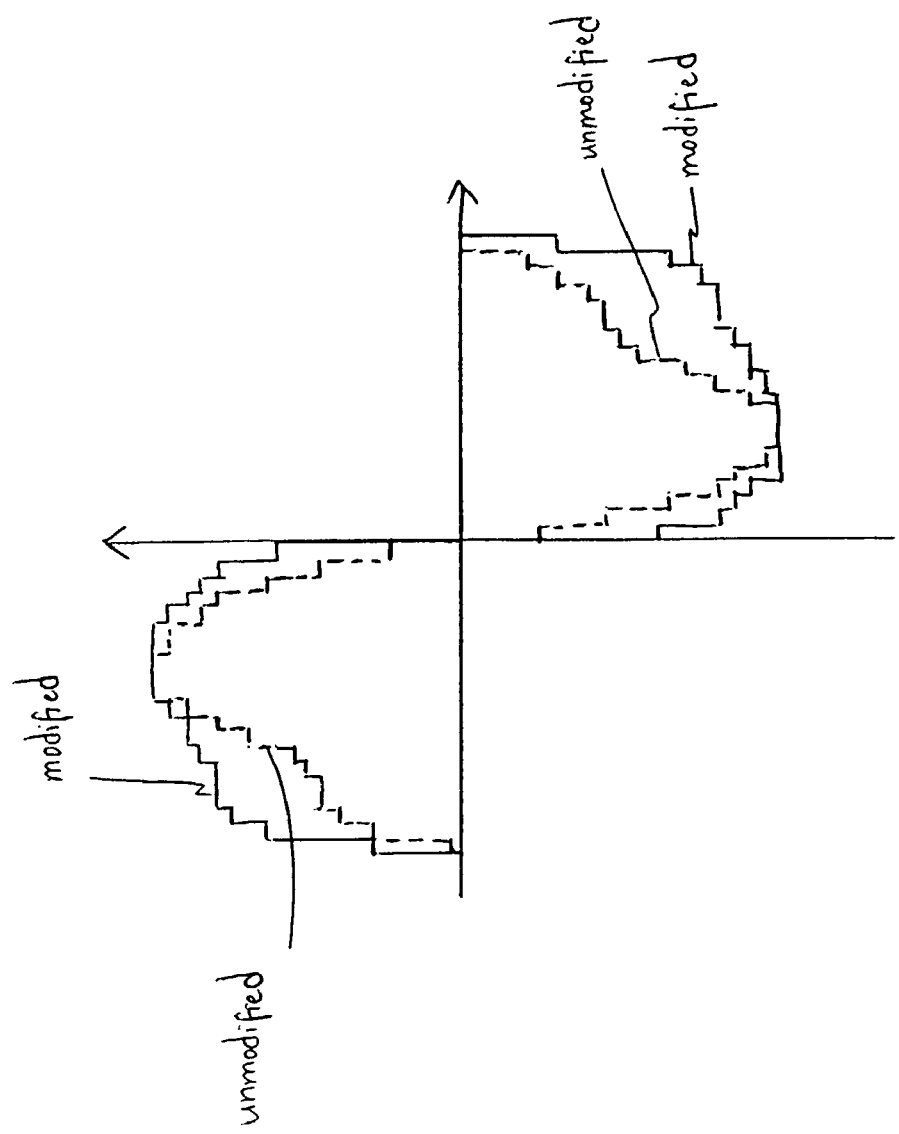
FIG. 4C is a schematic graph of a simple input waveform and the corresponding output from the digital sample mapping process.

The effect of applying this transfer function to a simple waveform is illustrated in FIG. 4C. It can be seen that the amplitude of the waveform is increased by a comparatively large amount when the input sample magnitude is small. The amplitude is increased by a progressively smaller amount as the input signal magnitude increases. Thus the magnitude of input samples which are far below the clipping level is preferentially increased but no additional clipping is introduced. The power spectrum of a waveform is given by the square of the amplitude spectrum so the net effect of the transfer function is to increase the average power level of the reproduced wave which results in an increase in perceived loudness of the reproduced audio signal.

Figure 5:
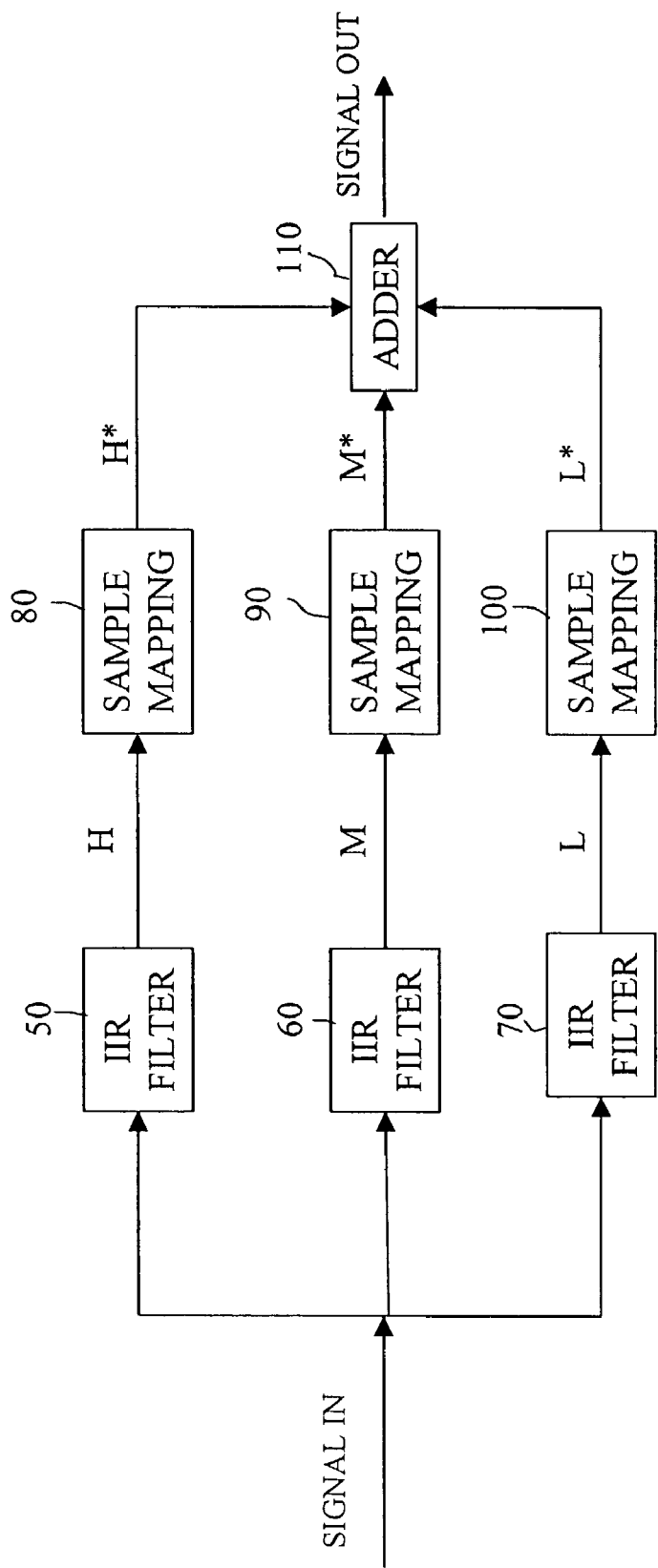
FIG. 5 is a schematic diagram of a digital audio signal processing apparatus according a second embodiment of the invention.

FIG. 5 illustrates a digital audio signal processor according to a second embodiment of the invention. An input digital audio signal is supplied to each of three infinite impulse response (IIR) filters 50, 60, 70 connected in parallel. A first IIR filter 50 passes a high frequency band signal; a second IIR filter 60 passes a medium frequency band signal; and a third IIR filter 70 passes a low frequency band signal L. In this embodiment the low frequency band L corresponds to frequencies less than 240 Hz, the mid frequency band M corresponds to 240 Hz-2400 Hz and the high frequency band H corresponds to frequencies greater than 2400 Hz.

The high frequency band signal H is supplied to a sample mapping module 80 where it is processed according to the time invariant transfer function of FIG. 4A to produce an output signal H*. The low frequency band signal L is supplied to a sample mapping module 100 where it is processed according to the time invariant transfer function of FIG. 4A to produce an output signal L*. The mid frequency band signal M is supplied to a sample mapping module 90 where the mid frequency band input is processed according to the time invariant transfer function of FIG. 4A to produce a output signal M*. The signals L*, M* and H* are supplied to an adder 110 where they are combined to produce an output signal.

This second embodiment of the invention separates the input digital audio signal into separate frequency bands to avoid intermodulation. The sample mapping is applied separately to each band and the bands are subsequently recombined. Intermodulation produces an undesirable nonlinear distortion characterised by the appearance, in the output audio signal, of frequencies that are linear combinations of the fundamental frequencies and of the harmonics that are present in the input signals. Although in certain circumstances this embodiment can produce output signals exceeding a normal maximum level (or requiring clipping) it has been found in subjective tests that the resulting audio signals can still have a pleasant, louder, sound.

In any embodiment of the invention a user control can be provided to control the signal mapping procedure. An on/off control can be provided for the user to select whether sample mapping should be implemented. A further user control can be provided to modify the form of the transfer function of FIG. 4A.

The user control may be used to set the value of a user-variable integer $\alpha$ that is used to produce a modified output signal as will now be described. A first digital audio sample mapping module is used to calculate a first output digital sample value from a given input digital audio sample value using a first transfer function and the first output digital sample value is fed to a first multiplier where it is multiplied by the user-adjustable variable $\alpha$, where $0 \leq \alpha < 1$, to produce a first modified output sample value. A second digital audio sample mapping module is used to calculate a second output digital sample value from the same given input digital sample value using a second, different transfer function and this second output digital sample value is fed to a second multiplier where it is multiplied by a variable $(1-\alpha)$ to produce a second modified output sample value. The first modified output sample value and the second modified output sample value are then fed as inputs to an adder where they are combined to produce the modified output signal.

A digital audio signal processing device according to embodiments of the invention is suitable for use in professional audio equipment, in broadcasting or in consumer equipment.

Figure 6:
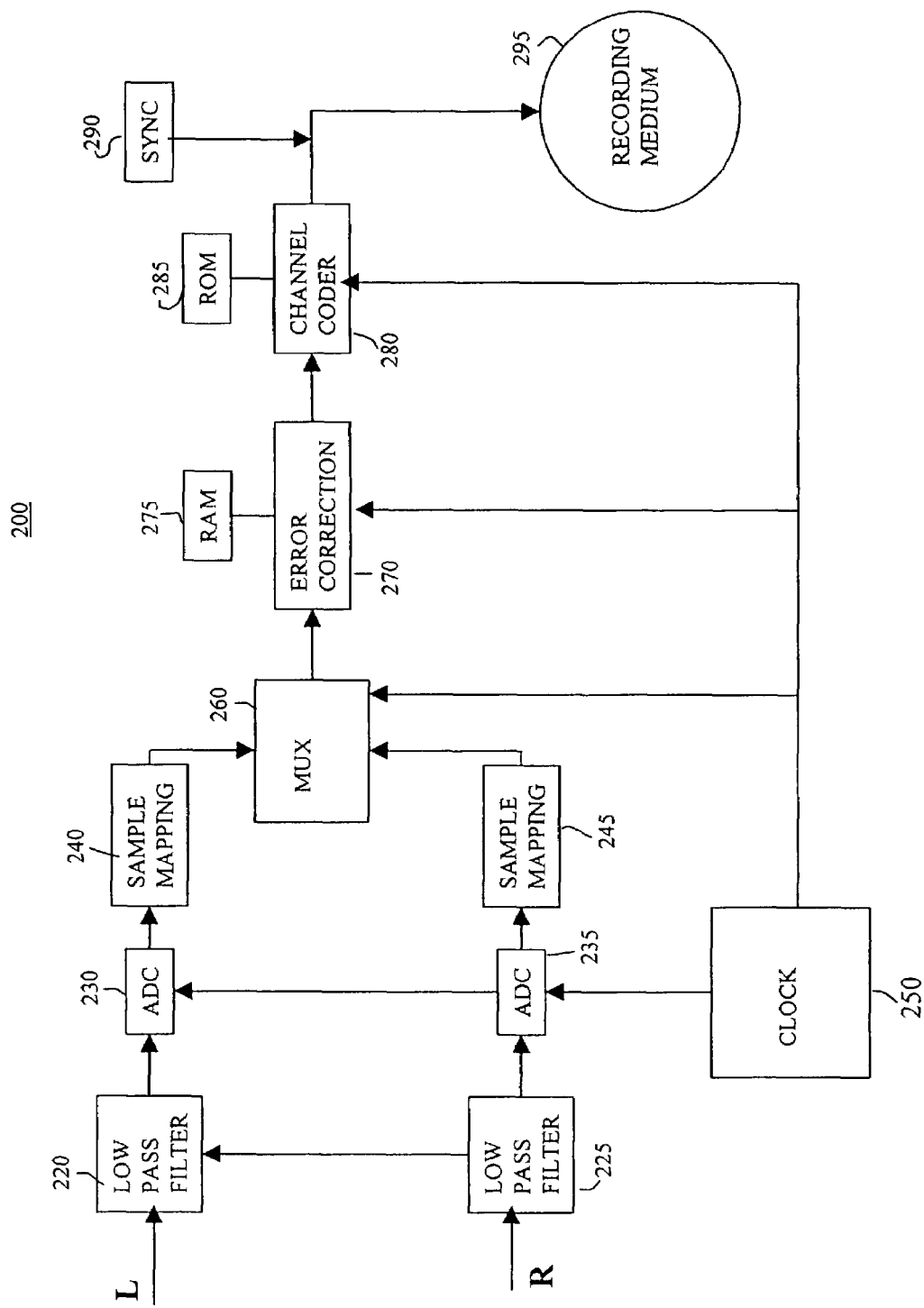
FIG. 6 is a schematic diagram of a recording apparatus according to embodiments of the invention.

FIG. 6 is a schematic diagram of a recording apparatus 200 according to embodiments of the invention. The audio recording apparatus receives an audio pair signal comprising a left channel L and a right channel R. The L-channel signal is fed to a low pass filter 220 which acts as an "anti-aliasing" filter thereby limiting the bandwidth offered for encoding. An output of the low pass filter 220 is supplied as input to a 16 bit A/D converter 230. The digital output signal from the A/D converter 230 is input to a sample mapping module 240.

The sample mapping module 240 implements the transfer function illustrated in FIG. 4A to the output digital sample values obtained from the ADC 230. The internal structure of the sample mapping module 240 in this case corresponds to the first embodiment of the invention discussed above with reference to FIG. 3. Alternatively, the sample mapping module could correspond to the second embodiment of the invention discussed above with reference to FIG. 5.

The signal R is processed in parallel with the signal L and is fed through a low pass filter 225, an A/D converter 235 and a sample mapping module 245 as described above for the L signal. The output of the L-channel sample mapping module 240 and the output of the R-channel sample mapping module 245 are supplied as inputs to a multiplexer 260. The output data stream of the multiplexer 260 comprises a sequence of 8-bit blocks with the L-channel data and the R-channel data arranged in an interlaced time sequence. The output of the multiplexer 260 is input to an error correction module 270 where data processing is performed to enable error correction on reproduction. The error correction module is connected to a random access memory (RAM) module 275. The output of the error correction module 270 is supplied as input to a channel coder 280. The channel coder 280 performs a bit-pattern transformation known as "eight to fourteen modulation" which reduces the likelihood of writing errors during recording and reading errors during reproduction. The channel coder 280 is connected to a read only memory (ROM) 285. The output data signal from the channel coder 280 is supplied to a recording medium 295 where the data is recorded under the control of a synchronising unit 290. Timing information is supplied to the A/D converters 230 and 235, the multiplexer 260, the error correction module 270 and the channel coder 280 by a clock 250.

Figure 7:
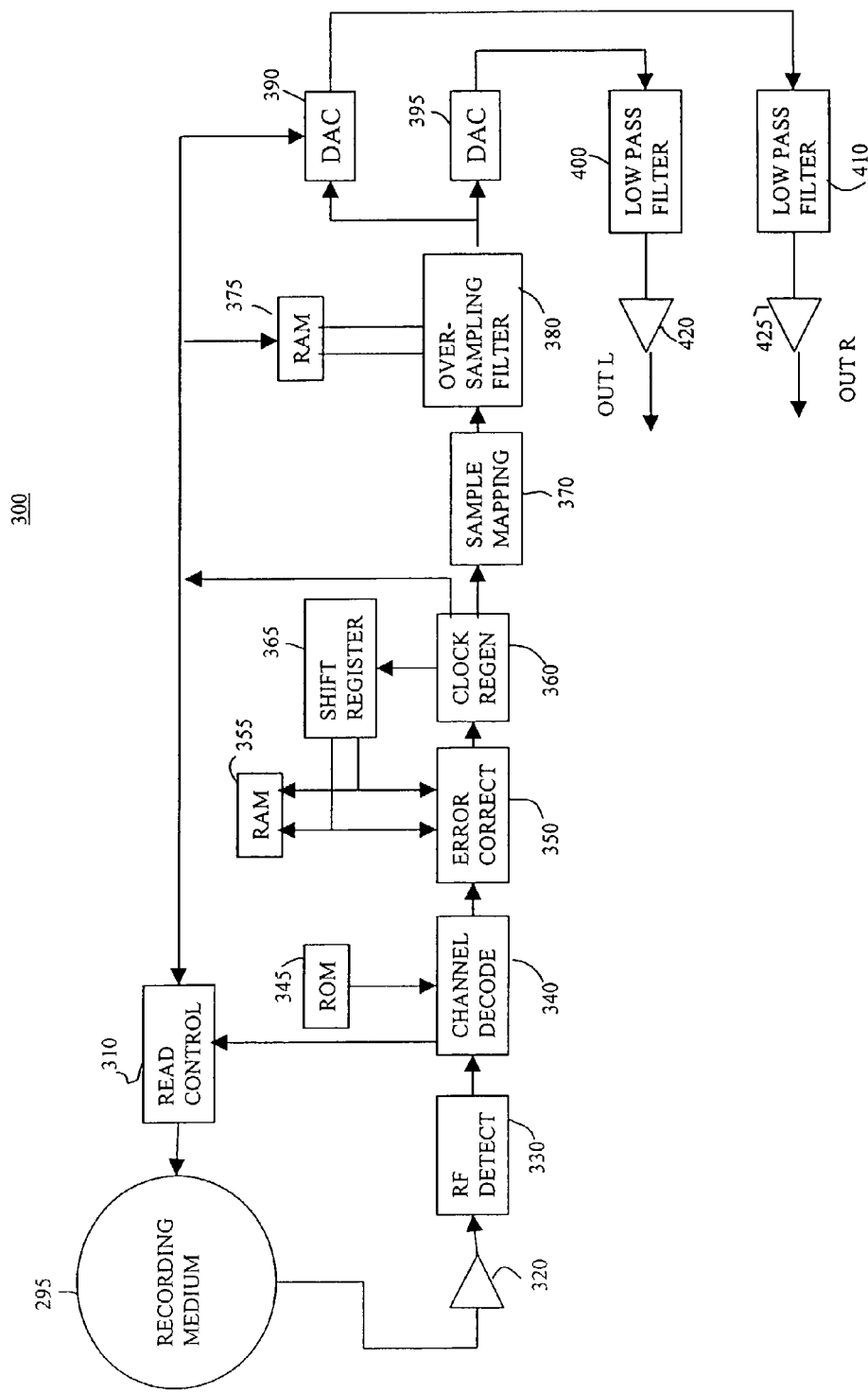
FIG. 7 is a schematic diagram of a reproducing apparatus according to embodiments of the invention.

FIG. 7 is a schematic diagram of a reproducing apparatus 300 according to embodiments of the invention. An RF data signal is obtained from the recording medium 295 by a reading operation under the control of a read controller 310. The RF signal is fed to an RF detection module via an RF amplifier 320. An output signal from the RF detection module is fed to a channel decode module 340 where fourteen to eight demodulation is performed. The output of the channel decode module 340 is supplied as a group of 8-bit symbols to an error correction module 350. The error correction module 350 detects and corrects read-out errors in the data. The error correction module is connected to a RAM unit 355.

The output of the error correction module 350 is fed to a clock regeneration (CR) circuit 360. The CR circuit 360 outputs a signal to a shift register 365 which is also connected to the error correction module 350. Under the control of the CR circuit 360, signal data blocks are read sequentially from the shift register 365 such that the output of the clock regeneration module 360 corresponds to precisely timed replicas of the original L-channel and R-channel pairs of digitally encoded signals. Timing information from the CR circuit 360 is supplied as input to the read control module 310 to ensure that the audio signal data are recovered at the correct bit rate. The output of the CR circuit 360 is fed to a sample mapping module 370. The sample mapping module 370 implements the transfer function illustrated in FIG. 4A to the output digital sample values obtained from the CR circuit 360. The internal structure of the sample mapping module 370 in this case corresponds to the first embodiment of the invention discussed above with reference to FIG. 3. Alternatively, the sample mapping module could correspond to the second embodiment of the invention discussed above with reference to FIG. 5.

The output of the sample mapping module 370 is fed to an "oversampling" filter 380 which performs interpolation between the digital input samples to increase the sampling rate on replay from 44.1 kHz to some multiple of this such as 176.4 kHz. The oversampling filter has a cut above the sampling frequency of 44.1 kHz. Nyquist theory requires a sampling rate of at least twice the highest audio frequency. The oversampling serves to improve the accuracy of, and reduce the noise-level inherent in the subsequent digital to analogue conversion. The oversampling filter is connected to a RAM unit 375.

The mapped output data from the sample mapping module 370 is supplied as input to a digital-to-analogue converter (DAC) 390 for the L-channel and to a DAC 395 for the R-channel. The output of the DAC 390 is fed to a low pass filter 400 and then output as reproduced L-channel audio data via an amplifier 420. Similarly, the output of the DAC 395 is fed to a low pass filter 410 and then output as reproduced R-channel audio data via an amplifier 425.

It will be appreciated that the embodiments of the invention described above may of course be implemented, at least in part, using software-controlled data processing apparatus. For example, one or more of the components schematically illustrated in FIGS. 3, 5, 6 and/or 7 may be implemented as a software-controlled general purpose data processing device or a bespoke program controlled data processing device such as an application specific integrated circuit, a field programmable gate array or the like. It will be appreciated that a computer program providing such software or program control and a storage, transmission or other providing medium by which such a computer program is stored are envisaged as aspects of the present invention.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A digital audio processing apparatus for processing a sequence of input digital audio sample values representing an input digital audio signal to generate a respective sequence of output digital audio sample values representing an output digital audio signal, said apparatus comprising:

a first digital audio sample mapping module operable to apply a quasi time-invariant transfer function to each input digital audio sample value to calculate a first output digital audio sample value from a given input digital audio sample value using said transfer function, said transfer function being arranged so that a ratio of root mean square signal level to peak signal magnitude is lower for said input digital audio signal than for a corresponding portion of said output digital audio signal;

a user control operable to modify said time-invariant transfer function, wherein said user control is operable to set a value of a user-adjustable variable α, where 0 ≦α<1;

a first multiplier operable to multiply said first output digital audio sample value by said user-adjustable variable α to produce a first modified output sample value;

a second digital audio sample mapping module operable to calculate a second output digital audio sample value from said given input digital sample value using a further, different transfer function;

a second multiplier operable to multiply said second output digital audio sample value by a variable (1−α) to produce a second modified output sample value; and an adder operable to add said first modified output sample value and said second modified output sample value.

2. An apparatus according to claim 1, in which said transfer function is such that a ratio of each of said output digital audio sample values to a respective input digital audio sample value generally increases as the magnitude of said input digital audio sample value decreases.

3. An apparatus according to claim 1 wherein said input digital audio sample values have a range and said digital audio sample mapping module implements said quasi time-invariant transfer function such that at upper and lower extremes of said range and at an input digital audio sample value representing zero amplitude, the output digital audio sample value is substantially equal to a corresponding input digital audio sample value.

4. An apparatus according to claim 1 wherein said quasi time-invariant transfer function is parabolic in form.

5. A digital audio processing apparatus for processing a sequence of input digital audio sample values representing an input digital audio signal to generate a respective sequence of output digital audio sample values representing an output digital audio signal, said apparatus comprising:

audio sample mapping modules operable to apply a quasi time-invariant transfer function to each input digital audio sample value, said transfer function being arranged so that a ratio of root mean square signal level to peak signal magnitude is lower for said input digital audio signal than for a corresponding portion of said output digital audio signal;

at least one digital filter operable to separate said input digital audio signal into at least two frequency bands and to supply said separated signals to respective digital audio sample mapping modules; and a combiner operable to combine outputs of said digital audio sample mapping modules to produce a digital audio output signal, wherein said respective digital audio sample mapping modules are configured to process the separated signals using the same transfer function and said transfer function is given by:

$y=2x(1-\text{abs}(0.5x))$, where y represents the output sample value, x represents the input sample value, and abs represents the absolute value function.

6. An apparatus according to claim 1, comprising a user control operable to switch said digital audio sample mapping module on or off.

7. An apparatus according to claim 1 in which said further, different transfer function is such that said second output digital sample value is substantially equal to said given input digital sample value.

8. A recording apparatus comprising:
an audio signal detection circuit configured to detect an input audio signal;
a digital audio processing apparatus according to claim 1;
a digital audio coding circuit operable to said output digital audio samples into a coded digital audio signal suitable for recording on a recording medium; and
a device operable to record said coded digital audio signal on a recording medium.

9. A reproducing apparatus comprising:
a read control circuit configured to read a coded digital audio signal from a recording medium;
a digital audio decoding circuit operable to decode said coded digital audio signal to produce input digital audio samples;
a digital audio processing apparatus according to claim 1; and
an audio signal reproduction circuit operable to convert said output digital audio samples to an output audio signal and to reproduce said output audio signal.

10. The apparatus according to claim 1, wherein said digital audio sample mapping module comprises a look-up table addressable from input sample values.

11. The apparatus according to claim 1, wherein said transfer function is given by:

$y=2x(1-\text{abs}(0.5x))$, where y represents the output sample value, x represents the input sample value, and abs represents the absolute value function.

12. The apparatus according to claim 5, wherein said digital audio sample mapping module comprises a look-up table addressable from input sample values.

13. An apparatus according to claim 5, in which said transfer function is such that a ratio of each of said output digital audio sample values to a respective input digital audio sample value generally increases as the magnitude of said input digital audio sample value decreases.

14. An apparatus according to claim 5 wherein said input digital audio sample values have a range and said digital audio sample mapping module implements said quasi time-invariant transfer function such that at upper and lower extremes of said range and at an input digital audio sample value representing zero amplitude, the output digital audio sample value is substantially equal to a corresponding input digital audio sample value.

15. An apparatus according to claim 5 wherein said quasi time-invariant transfer function is parabolic in form.

16. An apparatus according to claim 5, comprising a user control operable to switch said digital audio sample mapping module on or off.

17. A recording apparatus comprising:
an audio signal detection circuit configured to detect an input audio signal;
a digital audio processing apparatus according to claim 5;
a digital audio coding circuit operable to said output digital audio samples into a coded digital audio signal suitable for recording on a recording medium; and
a device operable to record said coded digital audio signal on a recording medium.

18. A reproducing apparatus comprising:
a read control circuit configured to read a coded digital audio signal from a recording medium;
a digital audio decoding circuit operable to decode said coded digital audio signal to produce input digital audio samples;

a digital audio processing apparatus according to claim 5; and an audio signal reproduction circuit operable to convert said output digital audio samples to an output audio signal and to reproduce said output audio signal.

19. A digital audio processing method for processing a sequence of input digital audio sample values representing an input digital audio signal to generate a respective sequence of output digital audio sample values representing an output digital audio signal, comprising:

generating the sequence of output digital audio sample values representing the output digital audio signal by applying a quasi time-invariant transfer function to each input digital audio sample value of the input digital audio signal;

using the transfer function so that a ratio of root mean square signal level to peak signal magnitude is lower for said input digital audio signal than for a corresponding portion of said output digital audio signal;

modifying said transfer function with a user control operable to set a value of a user-adjustable variable $\alpha$, where $0 \leq \alpha < 1$;

calculating a first output digital audio sample value from a given input digital audio sample value using said transfer function;

multiplying said first output digital audio sample value by said user-adjustable variable $\alpha$ to produce a first modified output sample value;

calculating a second output digital audio sample value from said given input digital sample value using a further, different transfer function;

multiplying said second output digital audio sample value by a variable $(1-\alpha)$ to produce a second modified output sample value; and adding said first modified output sample value and said second modified output sample value, wherein a perceived loudness of said output digital audio signal is increased based on said added first modified output sample value and second modified output sample value.

20. A computer readable storage medium storing computer software having a program code for causing a computer to execute the method according to claim 19.

21. A digital audio processing method for processing a sequence of input digital audio sample values representing an input digital audio signal to generate a respective sequence of output digital audio sample values representing an output digital audio signal, comprising:

generating the sequence of output digital audio sample values representing the output digital audio signal by applying a quasi time-invariant transfer function to each input digital audio sample value of the input digital audio signal;

using the transfer function so that a ratio of root mean square signal level to peak signal magnitude is lower for said input digital audio signal than for a corresponding portion of said output digital audio signal;

separating said input digital audio signal into at least two frequency bands; supplying said separated signals to respective digital audio sample mapping modules that use a same sample mapping transfer function;

said transfer function is given by:

$$y=2x(1-\text{abs}(0.5x)),$$

where y represents the output sample value, x represents the input sample value, and abs represents the absolute value function; and combining outputs of said digital audio sample mapping modules to produce a digital audio output signal wherein a perceived loudness of said output digital audio signal is increased based on said added first modified output sample value and second modified output sample value.

22. A computer readable storage medium storing computer software having a program code for causing a computer to execute the method according to claim 21.

* * * * *